(12) United States Patent
Smirnov et al.

(10) Patent No.: US 8,300,849 B2
(45) Date of Patent: Oct. 30, 2012

(54) PERCEPTUALLY WEIGHTED DIGITAL AUDIO LEVEL COMPRESSION

(75) Inventors: Serge Smirnov, Redmond, WA (US); James D. Johnston, Redmond, WA (US); Chris Messer, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 1184 days.

(21) Appl. No.: 11/935,972

(22) Filed: Nov. 6, 2007

(65) Prior Publication Data

US 2009/0116664 A1     May 7, 2009

(51) Int. Cl.
H03G 7/00 (2006.01)
H03G 3/00 (2006.01)

(52) U.S. Cl. .................. 381/106; 381/104; 381/107

(58) Field of Classification Search .......... 381/56–59, 381/72, 321, 102, 104, 106, 107; 704/200.1, 704/224, 225
See application file for complete search history.

(56) References Cited

U.S. PATENT DOCUMENTS

| | | | |
|---|---|---|---|
| 5,832,444 A | 11/1998 | Schmidt | |
| 5,923,768 A * | 7/1999 | Frindle et al. | 381/106 |
| 5,963,898 A | 10/1999 | Navarro | |
| 6,006,179 A | 12/1999 | Wu et al. | |
| 6,222,472 B1 | 4/2001 | Han | |
| 6,405,164 B1 | 6/2002 | Pinai | |
| 6,548,749 B2 * | 4/2003 | Suda | 84/660 |
| 6,564,184 B1 | 5/2003 | Eriksson | |
| 6,757,396 B1 * | 6/2004 | Allred | 381/106 |
| 6,807,524 B1 | 10/2004 | Bessette | |
| 6,882,976 B1 * | 4/2005 | Hsu et al. | 704/500 |
| 6,889,185 B1 | 5/2005 | McCree | |
| 6,947,886 B2 | 9/2005 | Rose et al. | |
| 7,225,123 B2 | 5/2007 | Ha | |
| 7,263,481 B2 | 8/2007 | Jabri et al. | |
| 7,848,531 B1 * | 12/2010 | Vickers et al. | 381/107 |
| 2003/0033338 A1 * | 2/2003 | Lindgren et al. | 708/315 |

(Continued)

FOREIGN PATENT DOCUMENTS

JP    2006-129434    5/2006

(Continued)

OTHER PUBLICATIONS

Schuller et al., "Perceptual Audio Coding Using Adaptive Pre- and Post-Filters and Lossless Compression," *IEEE Transactions on Speech and Audio Processing*, vol. 10, No. 6, pp. 379-390, Sep. 2002.

(Continued)

*Primary Examiner* — Devona Faulk
*Assistant Examiner* — David Ton
(74) *Attorney, Agent, or Firm* — Klarquist Sparkman, LLP

(57) ABSTRACT

The level of an audio signal can be compressed by receiving an input audio signal, determining a measure of loudness of the signal using a perceptually derived filter, determining a target gain amount, determining a current gain amount using piecewise linear attack/release logic, and producing an output audio signal by adjusting the input audio signal by the current gain amount. An audio compression filter for compressing the level of audio can comprise a loudness measuring module configured to determine a measure of loudness using a perceptually derived filter, and a compression module configured to determine a target gain amount, determine a current gain amount using piecewise linear attack/release logic, and adjust an input audio signal by the current gain amount. Audio level compression can be implemented using integer calculations.

22 Claims, 7 Drawing Sheets

U.S. PATENT DOCUMENTS

| | | | |
|---|---|---|---|
| 2004/0044534 A1 | 3/2004 | Chen | |
| 2007/0121966 A1 | 5/2007 | Plastina et al. | |
| 2007/0147518 A1 | 6/2007 | Bessette | |
| 2007/0291959 A1* | 12/2007 | Seefeldt | 381/104 |
| 2008/0212799 A1* | 9/2008 | Breitschadel | 381/106 |
| 2009/0304190 A1* | 12/2009 | Seefeldt et al. | 381/56 |

FOREIGN PATENT DOCUMENTS

| | | |
|---|---|---|
| WO | WO 2004/079936 | 9/2004 |

OTHER PUBLICATIONS

Noll et al., "Lossless and Perceptual Coding of Digital Audio" <http://www.nue.tu-berlin.de/publications/papers/EndresFestschriftNollLiebchen.pdf>, 13 pages, 2005.

International Search Report and Written Opinion, Application No. PCT/US2008/081407, 7 pages, Apr. 30, 2009.

* cited by examiner

PERCEPTUALLY WEIGHTED DIGITAL AUDIO LEVEL COMPRESSION

BACKGROUND

In part, the quality of audio that is played back to a listener depends on how the audio was recorded and how the audio was compressed (if at all). A playback device can sometimes perform processing during playback, however, to improve the listening experience.

Audio level compression, also called dynamic range compression, is often desirable for audio playback. For example, compression can compensate for a noisy environment. In a noisy environment, such as driving in a car or walking along a busy street, quiet sounds can be lost in the surrounding noise. Using compression allows the volume to be increased dynamically, thus increasing the level of the quiet sounds, while limiting the increase in the level of loud sounds.

Implementing digital audio level compression using floating-point math can be costly in terms of computing resources. For example, the computing resources used must support floating-point operations. In addition, audio devices, such as portable audio devices, typically consume more power when executing floating-point operations if floating-point is not supported by the hardware and must be emulated.

Compression involves reducing the level of loud sounds and/or increasing the level of quiet sounds. In order to determine sound level, most compressors use a purely analytical measure of signal strength, such as peak or RMS. However, these measures do not take into account human perception of loudness.

Therefore, there exists ample opportunity for improvement in technologies related to audio level compression.

SUMMARY

In summary, the detailed description is directed to various techniques and tools for audio level compression (dynamic range compression). For example, compression can be applied during audio playback using an audio playback device.

According to one aspect of the techniques and tools described herein, compressing the level of digital audio comprises receiving an input audio signal, determining a measure of loudness using a perceptually derived filter, determining a target gain amount based at least in part upon a target loudness level and the measure of loudness, determining a current gain amount using piecewise linear attack/release logic, and producing an output audio signal by adjusting the input audio signal by the current gain amount. The perceptually derived filter is derived, at least in part, from an approximation of human ear canal resonance.

In another aspect, an audio compression filter for compressing the level of digital audio comprises a loudness measuring module and a compression module. The loudness measuring module is configured to determine a measure of loudness of an input audio signal using a perceptually derived filter. The compression module is configured to determine a target gain amount based at least in part upon a target loudness level and the measure of loudness, determine a current gain amount using piecewise linear attack/release logic, and adjust the input audio signal by the current gain amount.

In yet another aspect, compressing the level of digital audio using integer calculations comprises receiving an input audio signal, determining a measure of loudness of the input audio signal using a perceptually derived linear that approximates human ear canal resonance, determining a target gain amount, determining a current gain amount using piecewise linear attack/release logic, and producing an output audio signal by adjusting the input audio signal by the current gain amount, where the method is performed, at least in part, using integer calculations.

The described techniques and tools for audio level compression can be implemented separately or in combination. For example, the techniques and tools can be implemented as stages of a digital signal processing (DSP) pipeline.

DETAILED DESCRIPTION

The following description is directed to techniques, tools, and solutions for audio level compression (dynamic range compression). The various techniques, tools, and solutions can be used in combination or independently. Different embodiments can implement one or more of the described techniques, tools, and solutions.

I. Example Audio Processing Device

The technologies, techniques, and solutions described herein can be implemented on any of a variety of devices in which audio signal processing is performed (e.g., audio processing devices), including among other examples, computers, portable audio players, MP3 players, digital audio/video players, PDAs, mobile phones, smart phones, DVD and CD players, audio conferencing devices, computer components such as audio or sound cards, network audio streaming devices, etc. The technologies, techniques, and solutions described herein can be implemented in hardware circuitry (e.g., in circuitry of an ASIC, FPGA, etc.), as well as in audio processing software executing within a computing device or other computing environment (e.g., executed on a central processing unit (CPU), a digital signal processor (DSP), or a combination).

Figure 1:
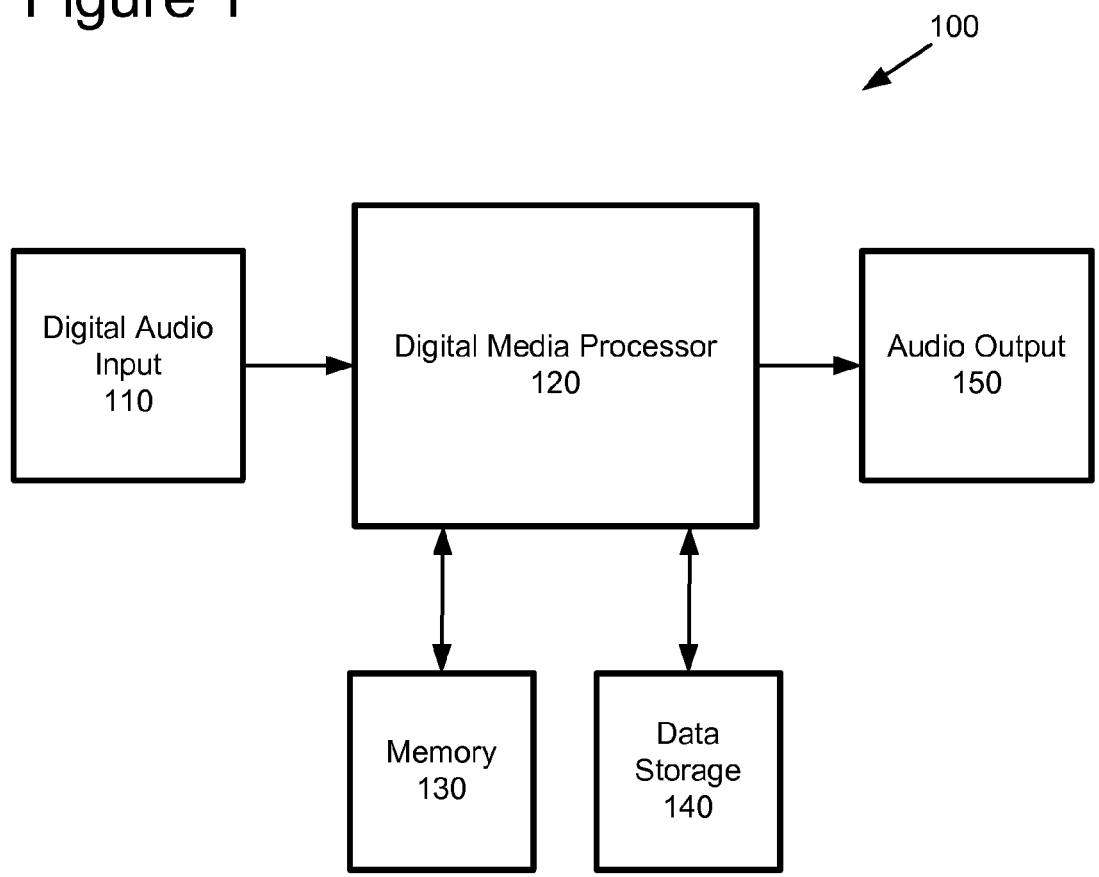
FIG. 1 is a block diagram of a suitable audio processing device in which some described techniques and tools may be implemented.

FIG. 1 depicts a generalized block diagram of a suitable audio processing device 100 in which described embodiments may be implemented. The audio processing device 100 is not intended to suggest any limitation as to scope of use or functionality of the invention, as the present invention may be implemented in diverse general-purpose or special-purpose computing environments.

With reference to FIG. 1, the audio processing device 100 includes a digital audio input 110. The digital audio input 110 can accept one or more channels of digital audio data (e.g., stereo or multi-channel). The digital audio data can be encoded (e.g., MP3, WMA Pro, AAC, etc.). The digital audio input 110 can accept digital audio data from a variety of sources (e.g., a computer, an audio device such as a CD player, a network source such as a wireless media server or streaming audio from the Internet, etc.).

The audio processing device 100 includes a digital media processor 120. The digital media processor comprises one or more processors, such as DSPs and/or CPUs. In a specific implementation, the digital media processor 120 is a DSP. The digital media processor 120 communicates with memory 130. The memory 130 can comprise working memory and/or program memory. The memory 130 can contain program code for operating the digital media processor 120 to implement the technologies described herein. The digital media processor 120 communicates with data storage 140. For example, the data storage 140 can include flash memory and/or hard drive storage for storing digital audio data.

The audio processing device 100 includes an audio output 150. For example, the audio output 150 can be a digital audio output (e.g., for driving a digital audio amplifier) or an analog audio output (e.g., comprising D/A converters and producing an analog audio line out).

For example, the digital media processor 120 can receive a digital audio input signal 110. If necessary, the digital media processor 120 can decode the input signal. The digital media processor 120 can compress the level of the audio input signal using the compression technologies described herein. For example, the digital media processor 120 can execute instructions from the memory 130 in order to implement various audio processing technologies. The processed audio signal can then be output 150.

The invention can be described in the general context of computer-executable instructions, such as those included in program modules, being executed in a computing environment on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing environment.

For the sake of presentation, the detailed description uses terms like "produce," "determine," and "apply" to describe computer operations in a computing environment. These terms are high-level abstractions for operations performed by a computer, and should not be confused with acts performed by a human being. The actual computer operations corresponding to these terms vary depending on implementation.

II. Example Audio Playback System

Figure 2:
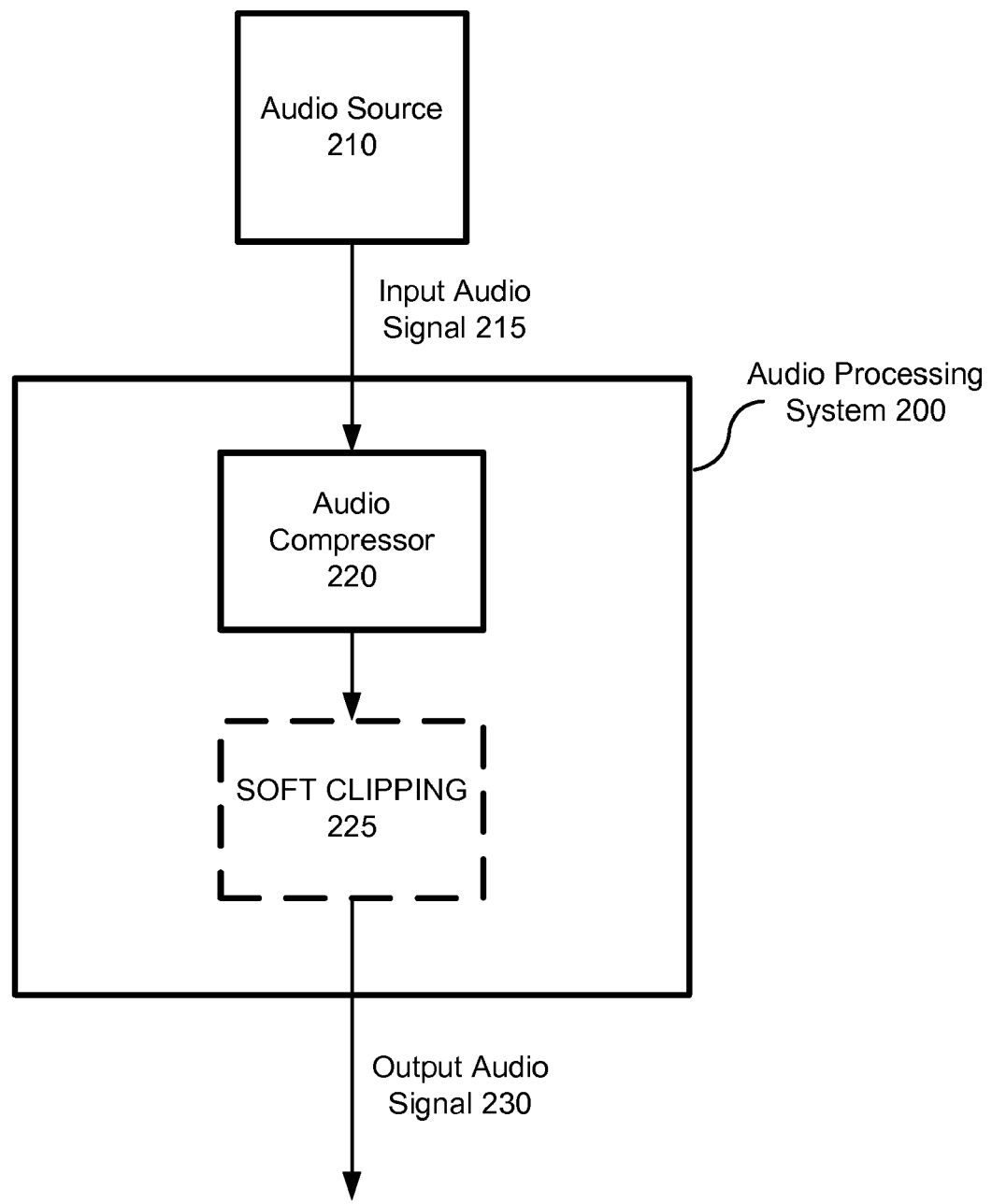
FIG. 2 is a block diagram of an audio playback system that can implement one or more of the solutions described herein.

The audio level compression technologies described herein can be implemented on any of a variety of devices (e.g., audio processing devices). For example, the system, depicted in FIG. 2, shows at a high level a device that can be used to implement the audio level compression technologies described herein.

In the example audio playback system for audio level compression, an audio signal 215 is obtained from an audio source 210, which may be a CD player, digital media device (e.g., a digital audio player), decoder for a digital audio stream (e.g., in a Windows Media Audio (WMA), WMA Pro, or other digital audio format), or other audio signal source. The audio signal can comprise one or more audio channels (e.g., stereo or multi-channel audio such as 5.1 or 7.1). The audio content can be coded and decoded using a variant of WMA Pro, AC3, AAC or other coding/decoding technologies. The audio source 210 can be an external source (as shown in FIG. 2), or internally integrated in the audio processing system 200.

An audio level compressor 220 processes the audio signal 215 (an input audio signal) to produce an output audio signal 230. For example, the audio level compressor 220 can be implemented as described below in relation to FIG. 4 or 5.

The output audio signal 230 can then be used to drive (e.g., using an audio amplifier) an audio output device, such as speakers or headphones. An optional soft clipping stage 225 can be incorporated in the audio processing system 200 (e.g., piecewise linear soft clipping or integer polynomial soft clipping).

The audio level compressor 220 can apply various compression techniques described herein (e.g., a perceptual loudness measure and/or piecewise linear attack/release logic) to compress the level of the input audio signal 215. In various applications, the audio processing system 200 can be implemented using a digital signal processor (DSP) or more generally a central processing unit (CPU) programmed to perform the signal processing techniques described herein.

The relationships shown between modules within the system indicate the main flow of information in the system; other relationships are not shown for the sake of simplicity. Depending on implementation and the type of processing desired in the system of FIG. 2 (or the other systems shown in the various topology and path diagrams presented in other Figures of the application), modules can be added, omitted, split into multiple modules, combined with other modules, and/or replaced with like modules.

III. Innovations in Digital Audio Level Compression

This section describes audio level compression (dynamic range compression) techniques and solutions that can be applied to playback of audio in various types of devices. For example, solutions for providing audio level compression can include one or more of the following features and techniques: determining a perceptual loudness measure, applying piecewise linear attack/release logic, applying piecewise linear soft clipping, applying integer polynomial soft clipping, and controlling compression parameters with user-settable parameters.

In some implementations, the compression techniques and solutions described herein are implemented entirely using integer calculations. For example, the compression techniques and solutions can be implemented on an audio playback device supporting integer math and not floating-point math (e.g., a low-power and/or computing resource limited audio playback device). In other implementations, the compression techniques and solutions are implemented in part using integer calculations (e.g., some operations are performed using integer calculations while other operations are performed using floating-point operations). For example, in a system (e.g., an audio processing device) which includes a floating-point DSP capable of implementing digital filters but not general purpose programming, the loudness measuring operations could be implemented using floating point math whereas piecewise-linear attack/release operations could be implemented using integer math.

Compression solutions can be implemented via software, hardware, or a combination thereof.

A. Perceptually Weighted Loudness Measure

Loudness of an audio signal can be measured in a variety of ways. One way of measuring loudness is to use a purely analytical measure of signal strength, such as peak or root mean square (RMS). However, using such a measure does not account for loudness as perceived by the human ear. For example, using such a measure of energy, signals at 100 Hz and 4,000 Hz, both at the same magnitude, would be treated as if they have the same loudness.

Figure 3:
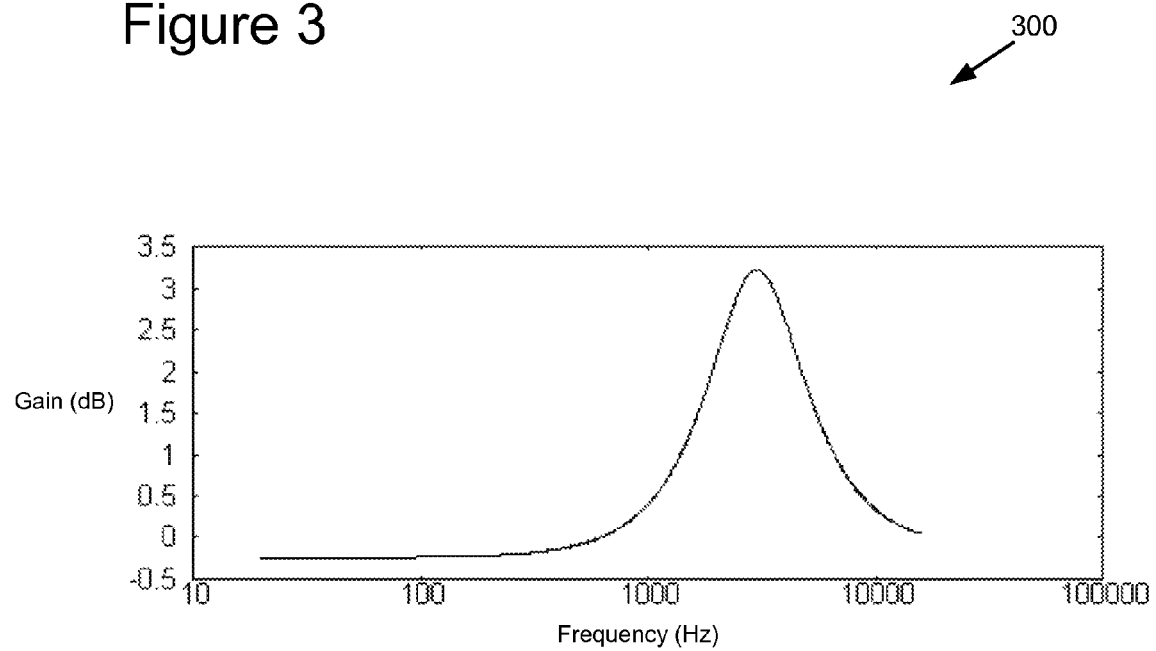
FIG. 3 depicts an example of a perceptual loudness curve.

Another way of measuring loudness, which more closely matches the human notion of loudness, is to use a loudness measure that approximates human ear canal resonance. FIG. 3 shows an example curve 300 representative of a filter that approximates human ear canal resonance. A filter that approximates the curve depicted in FIG. 3 can be used to measure loudness of an input audio signal. Using such a perceptual measure of loudness, a signal with the same energy at 100 Hz and 4,000 Hz would be treated as if the signal were much louder at 4,000 Hz than at 100 Hz.

In some implementations, the curve shape 300 is implemented by a second-order infinite impulse response (IIR) filter using 7 bits of coefficient precision using the following difference equation:

$$2/3*y[k]-y[k-1]+55/128*y[k-2]=92/128*x[k]-x[k-1]+3/8*x[k-2]$$

where y[ ] is the output sequence and x[ ] is the input sequence.

B. User-Settable Parameters

In some implementations, compression parameters can be configured by a user (e.g., a user of an audio playback system). For example, the user can provide compression parameters which can be used for controlling target (e.g., desired) loudness, maximum gain, and/or attack and release times. Compression parameters that are provided directly or indirectly by a user can be called user-settable parameters.

Compression parameters can be provided by a user in a variety of ways. For example, the user can enter compression parameters using a user interface (e.g., a user interface displayed by an audio playback system). The user interface can provide user interface elements, such as entry boxes, sliders, drop-down lists, wizards, or other types of user interface elements, for receiving the compression parameters from the user.

In a specific implementation, user-settable compression parameters comprise various combinations of a target loudness level user-settable parameter, a maximum gain user-settable parameter, and attack/release user-settable parameters.

C. Piecewise Linear Attack/Release

In a specific implementation, piecewise linear attack/release is implemented as shown in the following pseudocode (where log 2( ) can be an integer approximation of log-base-2 such as floor(log-base-2)).

```
attack_step = attack_count = 0;
release_step = 0;
if target_gain > previous_gain // previous_gain is gain applied for previous block
{ // set up release
    gain_diff_log2 = log2 ( target_gain – previous_gain )
    if gain_diff_log2 >= release_time_log2 // relatively
    fast release - release
        during each block
    {
        if block_size_log2 < gain_diff_log2 –
        release_time_log2 // fast
            release - release every sample
        {
            release_step = 2 ^ (gain_diff_log2 –
            release_time_log2 –
                block_size_log2);
            release_time_log2 = 0;
        }
        else // moderate speed release - release once per 2^N samples
        {
            Release_time_log2 = block_size_log2 –
            ( gain_diff_log2 –
                release_time_log2);
            release_step = 1;
        }
    }
    else // relatively slow release - release once per 2^N blocks
    {
        if block index is divisible by 2 ^ (release_time_log2 –
            gain_diff_log2)
        {
            previous_gain++; // just release the gain at the
            beginning - no
                need to set release_step
        }
    }
}
if target_gain < previous_gain
{ // set up attack
    gain_diff_log2 = log2 ( previous_gain – target_gain )
    attack_step = 2 ^ ( gain_diff_log2 – block_size_log2 –
    attack_time_log2 )
    attack_count = ( previous_gain – target_gain ) / attack_step;
}
// process data
instantaneous_gain = previous_gain;
for (every sample in the block to be processed)
{
    apply instantaneous_gain to the current sample
    if sample_index < attack_count
    {
        instantaneous_gain = instantaneous_gain – attack_step
    }
    if ( release_step is not 0 ) AND ( sample_index is divisible by 2 ^
        release_time_log2 )
    {
        instantaneous_gain = instantaneous_gain + release_step
    }
}
```

In a specific implementation, release_time_log 2 is 6 to 12, block size_log 2 is 9, and attack_time_log 2 is 0 to 3. In the above pseudocode, details on the direction of rounding and off-by-1 issues are omitted for clarity.

In some implementations, to save computational resources, attack/release logic is applied once per N samples, and between the applications of attack/release current gain follows a linear trajectory.

D. Audio Level Compression

Figure 4:
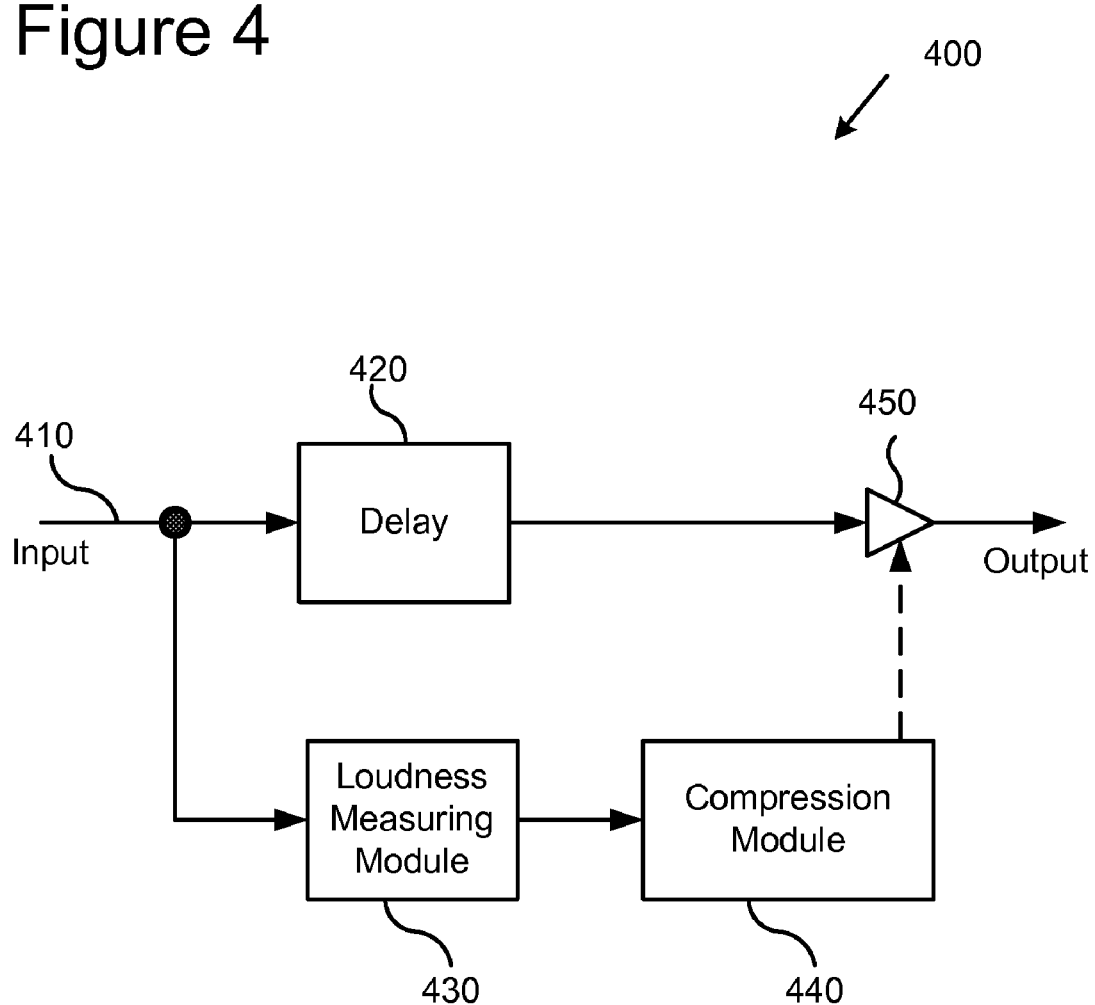
FIG. 4 depicts an example block diagram of a compressor.

FIG. 4 depicts a block diagram 400 of a digital audio level compressor. The compressor depicted in the block diagram 400 is implemented in part using a perceptual measure of loudness. The compressor depicted in the block diagram 400 can be implemented by an audio playback device to compress the level of an input audio signal.

In the diagram 400, an input audio signal 410 is split. A first path proceeds to a gain device 450 (for applying gain to the input audio signal 410). In the first path, an optional delay (e.g., a one block delay) 420 may be desirable in some implementations.

A second path proceeds to a loudness measuring module 430. The loudness measuring module is configured to determine a measure of loudness of the input audio signal 410 using a perceptually derived filter. In a specific implementation, the loudness measuring module 430 implements the second-order infinite impulse response (IIR) linear filter described in Section III(A) above.

Loudness measure results are passed from the loudness measuring module 430 to a compression module 440. The compression module 440 determines a gain amount to apply to the input audio signal 410 using the gain device 450, thus producing a compressed output audio signal.

In a specific implementation, the compression module 440 determines a target gain amount based at least in part upon a target loudness level (e.g., a user-settable parameter) and a measure of loudness (a measure of perceptual loudness) received from the loudness measuring module 430. Based at least in part on the target gain amount, the compression module 440 then determines a current gain amount (an instantaneous current gain amount to be applied to the input audio signal 410) using piecewise linear attack/release logic (e.g., as described in Section III(C) above). The compression module 440 adjusts the input audio signal 410 by the current gain amount using the gain device 450.

In some implementations, the compressed audio signal (after the gain device 450) is further processed by applying piecewise linear soft clipping or integer polynomial soft clipping.

In a specific implementation, the compressor 400 is implemented entirely in the integer domain (i.e., using integer calculations).

Figure 5:
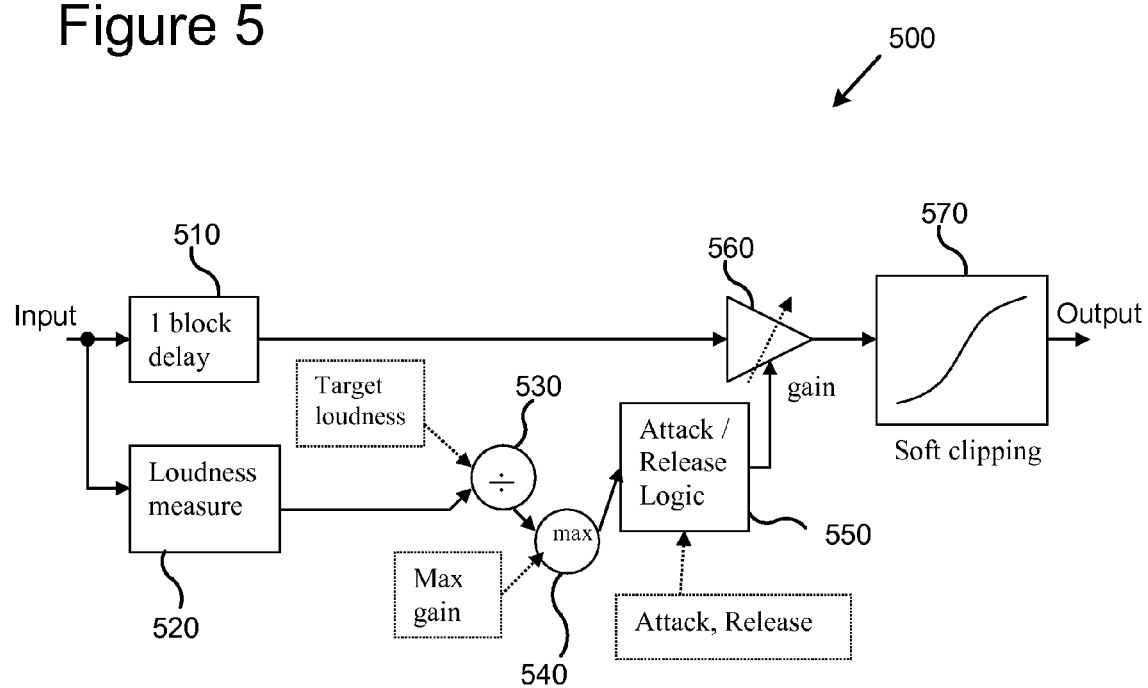
FIG. 5 depicts an example block diagram of a compressor including a loudness measure and user-settable parameters.

FIG. 5 depicts a block diagram 500 of a digital audio level compressor including a loudness measure and user-settable parameters. The compressor depicted in the block diagram 500 is implemented in part using a perceptual measure of loudness. The compressor depicted in the block diagram 500 can be implemented by an audio playback device to compress the level of an input audio signal.

In the diagram 500, a measure of the loudness of the input audio signal is determined using a perceptually derived filter 520. In general, the perceptually derived filter approximates loudness as perceived by the human ear. In a specific implementation, the measure of loudness is determined using the second-order infinite impulse response (IIR) linear filter described in Section III(A) above. In some implementations, the loudness measure is an aggregate loudness measure generated from multiple input samples.

Using the measure of loudness and a target loudness level (e.g., a user-configurable parameter or a pre-configured value), a target gain amount is determined 530. The target gain amount is limited by a maximum gain 540 (e.g., a maximum gain level can be received as a user-configurable parameter, or it can be a pre-configured value). In a specific implementation, the maximum gain is a ratio between 4:1 and 30:1.

Using the target gain amount, piecewise linear attack/release logic 550 determines a current gain amount (an instantaneous current gain amount). For example, the current gain amount can represent an average of the target gain over time. In some implementations, attack time and/or release time are user-settable parameters (e.g., attack time and/or release time values can be received, directly or indirectly, from a user). In some implementations, the current gain amount is determined based at least in part upon the target gain amount and a previous current gain amount.

The attack/release logic 550 applies the current gain amount to the input audio signal using a gain device 560. In some implementations, a one block delay 510 is applied to the input audio signal before being adjusted by the gain device 560.

In some implementations, the compressed audio signal (after the gain device 560) is further processed by applying soft clipping 570 (e.g., piecewise linear soft clipping or integer polynomial soft clipping).

Figure 6:
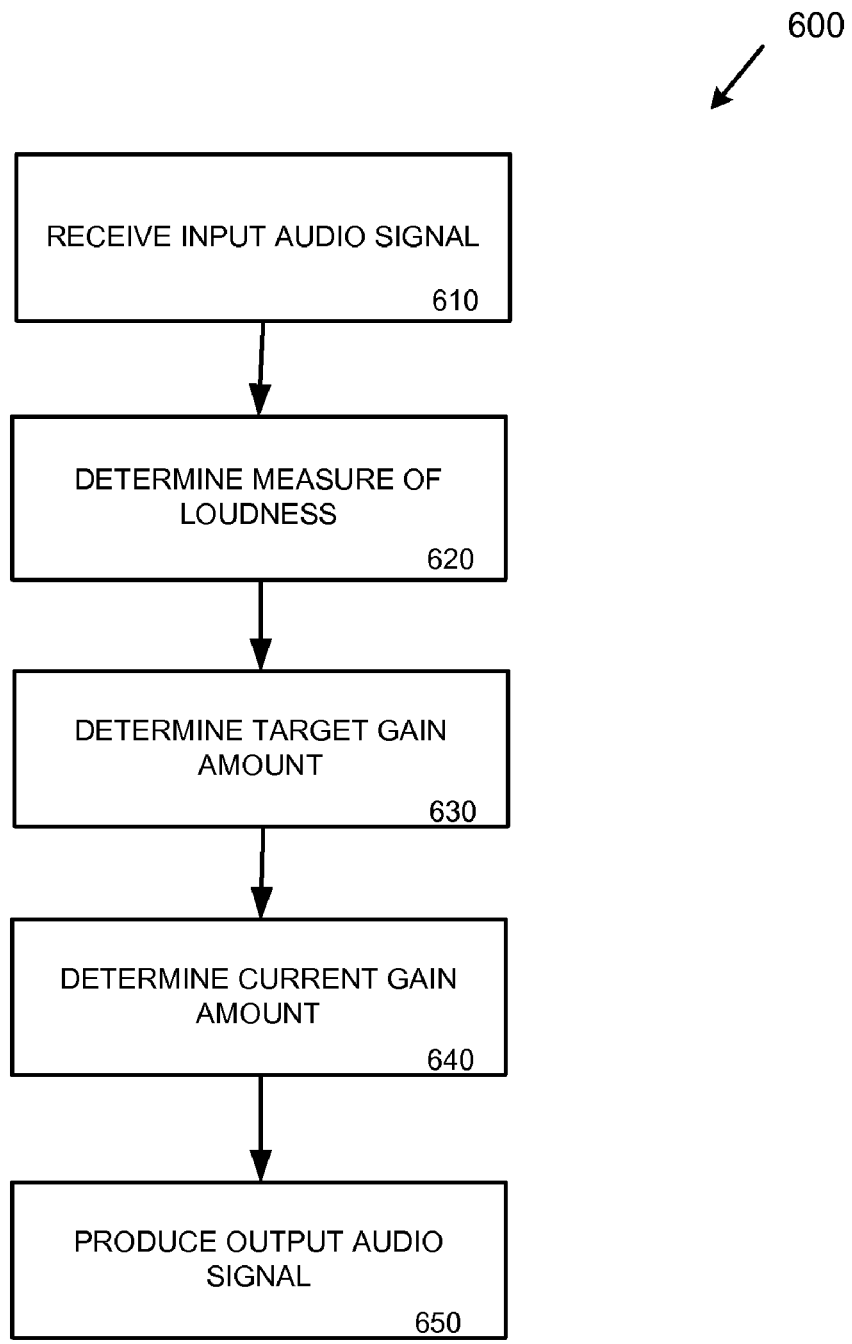
FIG. 6 depicts an example method for compressing audio.

FIG. 6 depicts an example method 600 for compressing audio. For example, the method 600 can be implemented using a compressor such as depicted in FIGS. 4 and 5.

At 610, an input audio signal is received. At 620, a measure of loudness of the input audio signal is determined using a perceptually derived filter. In general, the perceptually derived filter approximates loudness as perceived by the human ear. In a specific implementation, the measure of loudness is determined using the second-order infinite impulse response (IIR) linear filter described in Section III(A) above. In some scenarios, it is desirable to smooth the measure of loudness by aggregating the measure of loudness over multiple input samples (e.g., averaging over multiple input samples).

At 630, a target gain amount is determined based at least in part upon a target loudness level and the measure of loudness 620. In some implementations, the target loudness level is a user-configurable parameter (e.g., the target loudness level is set, directly or indirectly, by a user via a user interface).

At 640, a current gain amount (an instantaneous current gain amount) is determined, based at least in part on the target gain amount, using piecewise linear attack/release logic. In a specific implementation, the piecewise linear attack/release logic is implemented as described in the pseudocode in Section III(C) above.

At 650, an output audio signal is produced by adjusting the input audio signal 610 by the current gain amount 640.

In some implementations, the output audio signal 650 is further processed by applying soft clipping (e.g., piecewise linear soft clipping or integer polynomial soft clipping).

E. Soft Clipping

In some scenarios, it is generally desirable to implement soft clipping (e.g., integer soft clipping) in combination with compression. For example, soft clipping can be applied to a compressed audio signal. This section describes two integer soft clipping techniques, piecewise linear soft clipping and polynomial soft clipping.

In a specific implementation, the piecewise linear soft clipping technique maps all 32-bit signed integers (−2147483648 to +2147483647) to the signed 16-bit range (−32768 to +32767) in a way suitable for audio applications. First, the input value is constrained to the range −65535 to +65535 (values outside that range are hard-clipped, which is a reasonable choice for audio applications). The sign bit is removed and stored separately, so an unsigned 16-bit value in the range 0 to 65535 remains. The unsigned 16-bit value then undergoes a mapping according to a table. In a specific implementation, the following table (Table 1) is used (in this implementation, the piecewise linear segment size is 128*16 in the input domain):

TABLE 1

Piecewise Linear Soft Clipping Mapping Table

| Index | Add | Mul | Input Range | Output Range |
|---|---|---|---|---|
| 0 | 0 | 16 | 128 * 000 ... 128 * 016 − 1 | 128 * 000 ... 128 * 016 − 1 |
| 1 | 0 | 16 | 128 * 016 ... 128 * 032 − 1 | 128 * 016 ... 128 * 032 − 1 |
| 2 | 0 | 16 | 128 * 032 ... 123 * 048 − 1 | 128 * 032 ... 123 * 048 − 1 |
| 3 | 0 | 16 | 128 * 048 ... 123 * 064 − 1 | 128 * 048 ... 123 * 064 − 1 |
| 4 | 0 | 16 | 128 * 064 ... 123 * 080 − 1 | 128 * 064 ... 123 * 080 − 1 |
| 5 | 0 | 16 | 128 * 080 ... 123 * 096 − 1 | 128 * 080 ... 123 * 096 − 1 |
| 6 | 0 | 16 | 128 * 096 ... 123 * 112 − 1 | 128 * 096 ... 123 * 112 − 1 |
| 7 | 0 | 16 | 128 * 112 ... 123 * 128 − 1 | 128 * 112 ... 123 * 128 − 1 |
| 8 | 8 | 15 | 128 * 128 ... 128 * 144 − 1 | 128 * 128 ... 128 * 143 − 1 |
| 9 | 17 | 14 | 128 * 144 ... 128 * 160 − 1 | 128 * 143 ... 128 * 157 − 1 |

TABLE 1-continued

Piecewise Linear Soft Clipping Mapping Table

| Index | Add | Mul | Input Range | Output Range |
|---|---|---|---|---|
| 10 | 27 | 13 | 128 * 160 ... 128 * 176 − 1 | 128 * 157 ... 128 * 170 − 1 |
| 11 | 38 | 12 | 128 * 176 ... 128 * 192 − 1 | 128 * 170 ... 128 * 182 − 1 |
| 12 | 50 | 11 | 128 * 192 ... 128 * 208 − 1 | 128 * 182 ... 128 * 193 − 1 |
| 13 | 63 | 10 | 128 * 208 ... 128 * 224 − 1 | 128 * 193 ... 128 * 203 − 1 |
| 14 | 77 | 9 | 128 * 224 ... 128 * 240 − 1 | 128 * 203 ... 128 * 212 − 1 |
| 15 | 92 | 8 | 128 * 240 ... 128 * 256 − 1 | 128 * 212 ... 128 * 220 − 1 |
| 16 | 108 | 7 | 128 * 256 ... 128 * 272 − 1 | 128 * 220 ... 128 * 227 − 1 |
| 17 | 125 | 6 | 128 * 272 ... 128 * 288 − 1 | 128 * 227 ... 128 * 233 − 1 |
| 18 | 143 | 5 | 128 * 288 ... 128 * 304 − 1 | 128 * 233 ... 128 * 238 − 1 |
| 19 | 162 | 4 | 128 * 304 ... 128 * 320 − 1 | 128 * 238 ... 128 * 242 − 1 |
| 20 | 182 | 3 | 128 * 320 ... 128 * 336 − 1 | 128 * 242 ... 128 * 245 − 1 |
| 21 | 203 | 2 | 128 * 336 ... 128 * 352 − 1 | 128 * 245 ... 128 * 247 − 1 |
| 22 | 225 | 1 | 128 * 352 ... 128 * 368 − 1 | 128 * 247 ... 128 * 248 − 1 |
| 23 | 225 | 1 | 128 * 368 ... 128 * 384 − 1 | 128 * 248 ... 128 * 248 − 1 |
| 24 | 225 | 1 | 128 * 384 ... 128 * 400 − 1 | 128 * 249 ... 128 * 250 − 1 |
| 25 | 225 | 1 | 128 * 400 ... 128 * 416 − 1 | 128 * 250 ... 128 * 251 − 1 |
| 26 | 225 | 1 | 128 * 416 ... 128 * 432 − 1 | 128 * 251 ... 128 * 252 − 1 |
| 27 | 225 | 1 | 128 * 432 ... 128 * 448 − 1 | 128 * 252 ... 128 * 253 − 1 |
| 28 | 225 | 1 | 128 * 448 ... 128 * 464 − 1 | 128 * 253 ... 128 * 254 − 1 |
| 29 | 225 | 1 | 128 * 464 ... 128 * 480 − 1 | 128 * 254 ... 128 * 255 − 1 |
| 30 | 225 | 1 | 128 * 480 ... 128 * 496 − 1 | 128 * 255 ... 128 * 255 − 1 |
| 31 | 225 | 0 | 128 * 496 ... 128 * 512 − 1 | 128 * 255 ... 128 * 256 − 1 |

In Table 1, the 5 high-order bits of the unsigned 16-bit value are used as the table index (0-31). The "add" and "mul" values from the table are applied to the unsigned 16-bit value as follows (the division and multiplication by constants would be typically implemented using bitshifts):

*val*=(*val*\**mul*)/16+add\*128

For example, if the unsigned 16-bit value is 128*288+707=37571=1001001011000011b, table entry 10010b=18 is used to obtain add=143 and mul=5, so the unsigned 16-bit value becomes:

(37171*5)/16+143*128=30044=128*234+92

After the mapping is performed, the sign removed earlier is added back to obtain the final output.

Because the first quarter of Table 1 (indexes 0-7) is a direct mapping and the last quarter (indexes 24-31) is a fixed-slope 16:1 mapping, those portions of the table could be implemented using separate special-case code if table lookup is more expensive than conditional execution.

Integer polynomial soft clipping, like piecewise linear soft clipping, maps all 32-bit signed integers (−2147483648 to +2147483647) to the signed 16-bit range (−32768 to +32767) in a way suitable for audio applications.

The integer polynomial soft clipping implementation described herein requires more multiplications than the piecewise linear soft clipping implementation described above but has the following advantages: no table lookups, fewer operations overall, and slightly better audio quality.

In a specific implementation (order 3), integer polynomial soft clipping is implemented with the following C code:

```
INT16 clip3(INT32 i)
{
  INT32 a, b;
  #define LIM 49000
  if (i > LIM) i = LIM; else if (i < −LIM) i = −LIM;
  a = b = (i * 17) >> 5;
  a = (a * b) >> 15;
```

-continued

```
  a = (a * b) >> 15;
  return (INT16)(i − a);
}
```

Figure 7:
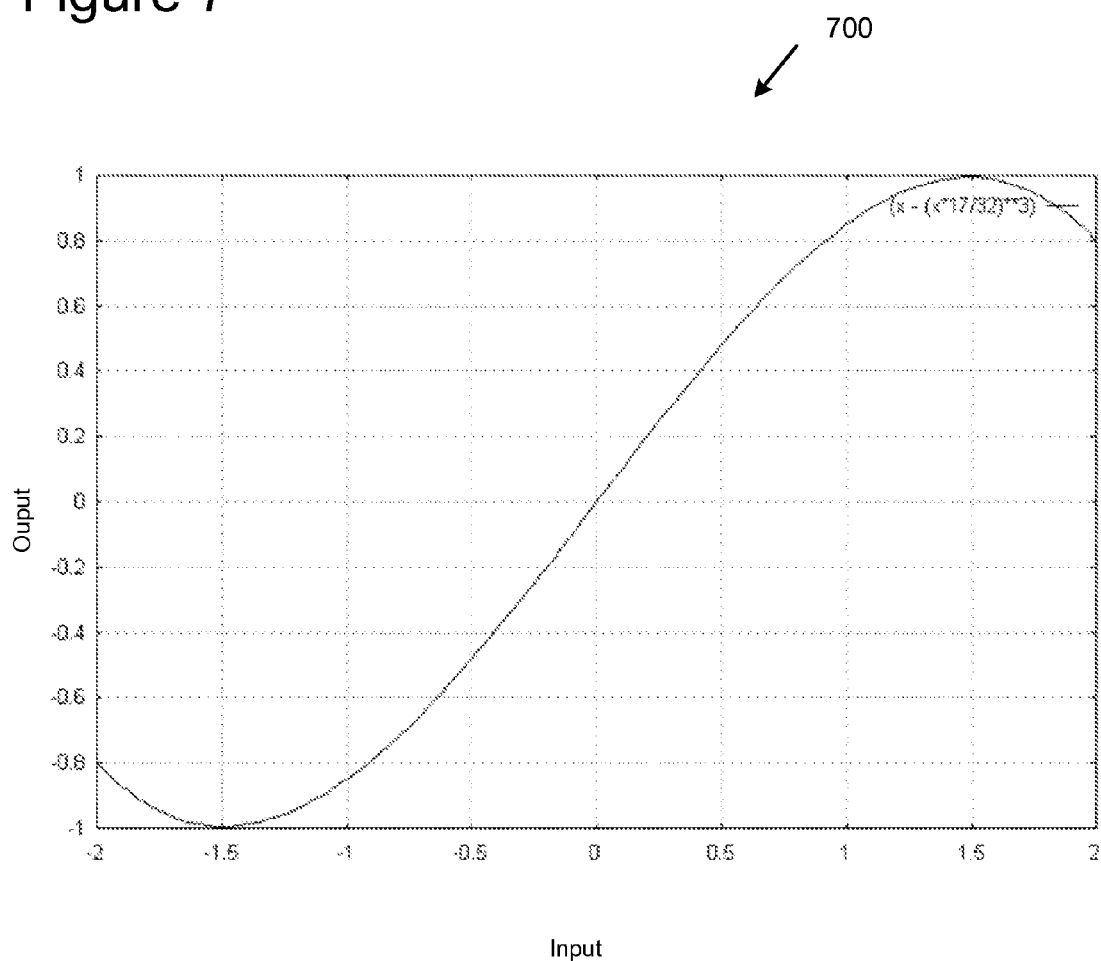
FIG. 7 depicts an example cubic curve.

Like piecewise linear soft clipping described above, integer polynomial soft clipping can be tuned for a desired gain for small signals (unity gain in this implementation). The $3^{rd}$ degree coefficient ($17/2^5$ in this implementation) is chosen so that the maximum output just reaches ~1.0 (~32768). The "LIM" value is chosen to avoid using portions of the cubic curve beyond its extrema (since it is desirable for a soft clipping function to be monotone increasing), see FIG. 7 (FIG. 7 is drawn with a scale 1.0=32768, so 1.5 corresponds to about 49000).

Higher order polynomials can be used, although $3^{rd}$ order handles larger input signals without saturation (e.g., a $5^{th}$ order version would require a LIM of about 41000 to keep the function monotone increasing). In some implementations, a power-of-two LIM value (e.g., +65535/−65536) can be used to improve the execution speed of the LIM logic (e.g., using bit operation tricks) but at the expense of allowing the clipping curve to become slightly non-monotone.

The audio level compression techniques and related technologies and solutions described in this application can be used in various combinations to implement an audio compressor. For example, an audio compressor can be implemented using a perceptual loudness filter and piecewise linear attack/release logic. Soft clipping (e.g., piecewise linear soft clipping or integer polynomial soft clipping) can be applied to a compressed audio signal. An audio compressor can receive user-settable compression parameters. An audio compressor can be implemented using integer calculations.

Any of the methods described herein can be performed via one or more computer-readable media (e.g., storage or other tangible media) having computer-executable instructions for performing (e.g., causing a computing device or computer to perform) such methods. Operation can be fully automatic, semi-automatic, or involve manual intervention.

Having described and illustrated the principles of our innovations in the detailed description and accompanying drawings, it will be recognized that the various embodiments can be modified in arrangement and detail without departing from such principles. It should be understood that the programs, processes, or methods described herein are not related or limited to any particular type of computing environment, unless indicated otherwise. Various types of general purpose or specialized computing environments may be used with or perform operations in accordance with the teachings described herein. Elements of embodiments shown in software may be implemented in hardware and vice versa.

In view of the many possible embodiments to which the principles of our invention may be applied, we claim as our invention all such embodiments as may come within the scope and spirit of the following claims and equivalents thereto.

We claim:

1. A method for compressing the level of digital audio, the method comprising:
   receiving an input audio signal that is divided into a plurality of blocks, each block comprising a plurality of samples;
   determining a measure of loudness of the input audio signal using a perceptually derived filter;
   determining a target gain amount based at least in part upon a target loudness level and the measure of loudness;
   based at least in part on the target gain amount, determining a first linear gain amount using piecewise linear attack/release logic to be applied to samples of a first block of the plurality of blocks;
   based at least in part on the target gain amount and on the first linear gain amount, determining a second linear gain amount using the piecewise linear attack/release logic to be applied to samples of a second block of the plurality of blocks, wherein the first linear gain amount is different from the second linear gain amount and wherein both the first linear gain amount and the second linear gain amount are applied to the respective blocks during one of either an attack phase or a release phase; and
   producing an output audio signal by adjusting the input audio signal by the first and the second linear gain amounts.

2. The method of claim 1 wherein the perceptually derived filter is derived from an approximation of human ear canal resonance.

3. The method of claim 1 wherein the perceptually derived filter is implemented using a second-order infinite impulse response linear filter.

4. The method of claim 1 wherein the perceptually derived filter is implemented using seven-bit integer coefficients.

5. The method of claim 1 wherein the target loudness level is a user-settable value.

6. The method of claim 1 further comprising:
   applying piecewise linear soft clipping to the output audio signal.

7. The method of claim 1 further comprising:
   applying integer polynomial soft clipping to the output audio signal.

8. The method of claim 1 wherein the determining the target gain amount comprises calculating a ratio of the target loudness level and the measure of loudness.

9. The method of claim 1 wherein the measure of loudness is an aggregate measure generated from a plurality of input samples.

10. The method of claim 1, wherein the method is implemented using integer calculations.

11. The method of claim 1 wherein the method is implemented, at least in part, by an audio processing device.

12. The method of claim 1, wherein the piecewise linear attack/release logic approximates a logarithmic function in determining the first and second linear gain amounts.

13. The method of claim 1, wherein the first and the second linear gain amounts are applied to the respective samples in integer increments.

14. The method of claim 1, wherein both the first linear gain amount and the second linear gain amount are applied during the attack phase.

15. One or more computer-readable storage media, not consisting of a signal, storing computer-executable instructions for causing an audio processing device to perform the method of claim 1.

16. An audio compression filter, implemented at least in part by an audio processing device, for compressing the level of digital audio, the filter comprising:
   a loudness measuring module, wherein the loudness measuring module is configured to determine a measure of loudness of an input audio signal using a perceptually derived filter, and wherein the input audio signal is divided into a plurality of blocks, each block comprising a plurality of samples; and
   a compression module, wherein the compression module is configured to:
      determine a target gain amount based at least in part upon a target loudness level and the measure of loudness determined by the loudness measuring module;
      based at least in part on the target gain amount, determine a first linear gain amount using piecewise linear attack/release logic to be applied to samples of a first block of the plurality of blocks;
      based at least in part on the target gain amount and on the first linear gain amount, determining a second linear gain amount using the piecewise linear attack/release logic to be applied to samples of a second block of the plurality of blocks, wherein the first linear gain amount is different from the second linear gain amount and wherein both the first linear gain amount and the second linear gain amount are applied to the respective blocks during one of either an attack phase or a release phase; and
      adjust the input audio signal by the first and the second linear gain amounts to produce an output audio signal;
   wherein the loudness measuring module and the compression module use integer calculations.

17. The filter of claim 16 wherein the perceptually derived filter is derived from an approximation of human ear canal resonance.

18. The filter of claim 16 wherein the perceptually derived filter is implemented using a second-order infinite impulse response linear filter, which is implemented using seven-bit integer coefficients.

19. A method for compressing the level of digital audio using integer calculations, the method comprising:
   receiving an input audio signal that is divided into a plurality of blocks, each block comprising a plurality of samples;
   determining, using integer calculations, a measure of loudness of the input audio signal using a perceptually derived filter, wherein the perceptually derived filter is derived from an approximation of human ear canal resonance;
   determining, using integer calculations, a target gain amount based at least in part upon a target loudness level and the measure of loudness, wherein the determining the target gain amount comprises calculating a ratio of the target loudness level and the measure of loudness;

based at least in part on the target gain amount, determining, using integer calculations, a first linear gain amount using piecewise linear attack/release logic to be applied to samples of a first block of the plurality of blocks;

based at least in part on the target gain amount and on the first linear gain amount, determining using integer calculations, a second linear gain amount using the piecewise linear attack/release logic to be applied to samples of a second block of the plurality of blocks, wherein the first linear gain amount is different from the second linear gain amount and wherein both the first linear gain amount and the second linear gain amount are as applied to the respective blocks during one of either an attack phase or a release phase; and producing an output audio signal by adjusting the input audio signal by the first and the second linear gain amounts.

20. The method of claim 19 wherein the perceptually derived filter is implemented using a second-order infinite impulse response linear filter with seven-bit integer coefficients.

21. The method of claim 19 wherein the method is implemented, at least in part, by an audio processing device.

22. The method of claim 19 further comprising:

applying one of piecewise linear soft clipping and integer polynomial soft clipping to the output audio signal.

* * * * *